(12) United States Patent
Borthakur et al.

(10) Patent No.: US 9,338,350 B2
(45) Date of Patent: May 10, 2016

(54) IMAGE SENSORS WITH METALLIC NANOPARTICLE OPTICAL FILTERS

(71) Applicant: Semiconductor Components Industries, LLC, Phoenix, AZ (US)

(72) Inventors: Swarnal Borthakur, Boise, ID (US); Brian Vaartstra, Nampa, ID (US); Marc Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 42 days.

(21) Appl. No.: 14/291,628

(22) Filed: May 30, 2014

(65) Prior Publication Data

US 2015/0350540 A1 Dec. 3, 2015

(51) Int. Cl.
*G02B 5/20* (2006.01)
*H04N 5/232* (2006.01)
*H04N 9/04* (2006.01)

(52) U.S. Cl.
CPC ............ *H04N 5/23232* (2013.01); *G02B 5/206* (2013.01); *H04N 9/045* (2013.01)

(58) Field of Classification Search
CPC . H04N 5/2254; H04N 5/23232; G02B 5/201; G02B 5/206; G02B 5/208
See application file for complete search history.

(56) References Cited

U.S. PATENT DOCUMENTS

| | | | |
|---|---|---|---|
| 5,270,854 A | 12/1993 | Lee et al. | |
| 5,615,030 A * | 3/1997 | Harada | G02B 5/201 349/110 |
| 7,920,189 B2 * | 4/2011 | Goto | H01L 27/14621 250/208.1 |
| 8,779,541 B2 * | 7/2014 | Nakajiki | H01L 27/14627 257/432 |
| 2005/0057708 A1* | 3/2005 | Kuo | G02F 1/133514 349/106 |
| 2007/0030380 A1* | 2/2007 | Higuchi | H01L 27/14625 348/340 |
| 2008/0225142 A1* | 9/2008 | Goto | H01L 27/14621 348/272 |
| 2009/0244745 A1* | 10/2009 | Komuro | G02B 5/205 359/885 |
| 2009/0250594 A1* | 10/2009 | Tanaka | G02B 5/201 250/208.1 |
| 2012/0262500 A1* | 10/2012 | Kitazawa | G02B 5/008 345/690 |
| 2013/0134537 A1* | 5/2013 | Nakajiki | H01L 27/14627 257/432 |
| 2014/0049812 A1* | 2/2014 | Palanchoke | G02B 5/208 359/360 |

OTHER PUBLICATIONS

Stepanov, et al., "Nonlinear Optical Properties of Implanted Metal Nanoparticles in Various Transparent Matrixes: A Review", p. 115-145, Rev. Adv. Mater. Sci. 27, 2011.

Torrell, et al., "Nanoscale color control of TiO2 films with embedded Au nanoparticles", Materials Letters, 2010.

(Continued)

*Primary Examiner* — Nicholas Giles
(74) *Attorney, Agent, or Firm* — Treyz Law Group, P.C.; Kendall P. Woodruff

(57) ABSTRACT

An imaging system may include one or more optical filters that include metallic nanoparticles in a matrix. The metallic nanoparticle optical filters may form a color filter array for an imager in the imaging system. Different metallic nanoparticle optical filters may be formed for each desired color. Properties of the metallic nanoparticles and matrices may be varied to achieve the desired optical filtering properties and pass the desired wavelength bands to the imager. As examples, the type of metal, the size of the nanoparticles, the shape of the nanoparticles, and the type of matrix in which the nanoparticles are formed may all influence the optical properties of the resulting metallic nanoparticle optical film.

22 Claims, 4 Drawing Sheets

(56) References Cited

OTHER PUBLICATIONS

Liz-Marzan, "Tailoring Surface Plasmons through the Morphology and Assembly of Metal Nanoparticles", pp. 32-41, Langmuir 22, 2006.

Gold Nanoparticles: Properties and Applications [online]. Aldrich Materials Science. [Retrieved on Nov. 21, 2014]. Retrieved from the Internet: <http://www.sigmaaldrich.com/materials-science/nanomaterials/gold-nanoparticles.html>.

Perez-Robles, et al., "Optical Phonons in SiO2 Sol-Gel Derived Colored Glasses Doped with Cu and Fe", pp. 49-61, Physica Status Solidi (a), 1999.

West, et al., "Searchiing for Better Plasmonic Materials," pp. 795-808, Laser & Photonics Reviews, 2010.

* cited by examiner

IMAGE SENSORS WITH METALLIC NANOPARTICLE OPTICAL FILTERS

BACKGROUND

This relates generally to imaging systems, and more particularly, to metallic nanoparticle optical filters for imaging systems.

Modern electronic devices such as cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

Conventional imaging systems include a color filter array and other optical filters, which are typically formed with spin-coating processes. Optical filters formed with conventional spin-coating processes often have undesirable defects that result in streaks, bands, and other problems in captured images. Additionally, these defects can reduce the effective manufacturing yield.

It would therefore be desirable to be able to provide improved optical filters for image sensors.

DETAILED DESCRIPTION

Figure 1:
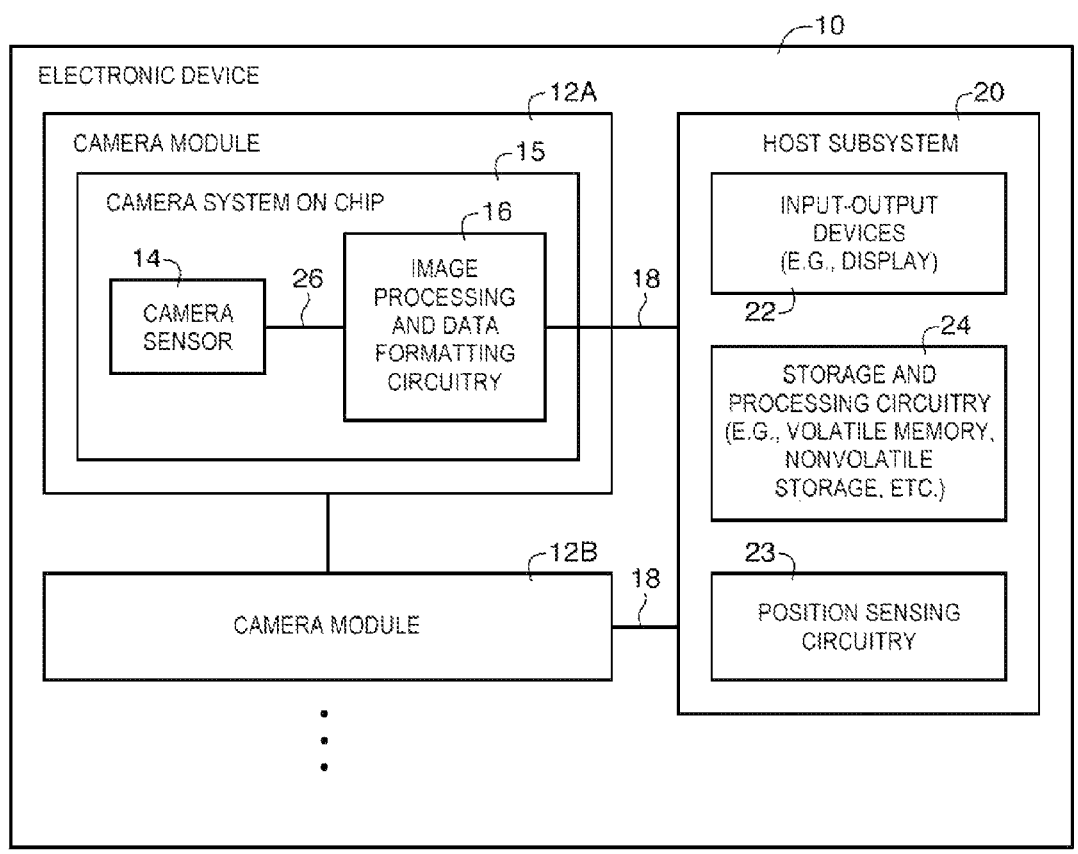
FIG. 1 is a diagram of an electronic device and computing equipment that may include an image sensor with metallic nanoparticle optical filters in accordance with embodiments of the present invention.

Digital camera modules are widely used in electronic devices. An electronic device with a digital camera module is shown in FIG. 1. Electronic device 10 may be a digital camera, a laptop computer, a display, a computer, a cellular telephone, or other electronic device. Device 10 may include one or more imaging systems such as imaging systems 12A and 12B (e.g., camera modules 12A and 12B) each of which may include one or more image sensors 14 and corresponding lenses. During operation, a lens focuses light onto an image sensor 14. The lens may have fixed aperture. The pixels in image sensor 14 include photosensitive elements that convert the light into digital data. Image sensors may have any number of pixels (e.g., hundreds or thousands or more). A typical image sensor may, for example, have millions of pixels (e.g., megapixels). In high-end equipment, sensors with 10 megapixels or more are not uncommon. In at least some arrangements, device 10 may include two (or more) image sensors 14, which may capture images from different perspectives. When device 10 includes two image sensors 14, device 14 may be able to capture stereo images.

Still and video image data from camera sensor 14 may be provided to image processing and data formatting circuitry 16 via path 26. Image processing and data formatting circuitry 16 may be used to perform image processing functions such as adjusting white balance and exposure and implementing video image stabilization, image cropping, image scaling, etc. Image processing and data formatting circuitry 16 may also be used to compress raw camera image files if desired (e.g., to Joint Photographic Experts Group or JPEG format).

In some arrangements, which is sometimes referred to as a system on chip or SOC arrangement, camera sensor 14 and image processing and data formatting circuitry 16 are implemented as a common unit 15 (e.g., on a common integrated circuit, or stacked together). The use of a single integrated circuit to implement camera sensor 14 and image processing and data formatting circuitry 16 can help to minimize costs. If desired, however, multiple integrated circuits may be used to implement circuitry 15. In arrangements in which device 10 includes multiple camera sensors 14, each camera sensor 14 and associated image processing and data formatting circuitry 16 can be formed on a separate SOC integrated circuit (e.g., there may be multiple camera system on chip modules such as modules 12A and 12B).

To save space and simplify assembly by a manufacturer of a camera or other electronic device in which imaging capabilities are desired, it may be desirable to stack a processor (e.g., processing circuitry 16, or a processor in camera sensor 14) and an imager (e.g., camera sensor 14) to form a preassembled image sensor unit 15. An image sensor unit 15 that is formed in this way has the image sensing capabilities of the imager and the processing capabilities of the processor in a single component. Additionally, in arrangements in which the processor 16 (sometimes referred to herein as an image co-processor iCP) has a smaller area than the imager 14, forming the processor 16 on a separate wafer may decrease the cost of the processor 16, by allowing more processors 16 to be formed on each wafer. Moreover, processors 16 and imagers 14 may be formed on different types of wafers, each of which may be optimized for their respective use. As an example, a wafer of image co-processors 16 may be optimized for analog circuitry (to optimize the performance of analog circuitry in the image co-processors such as sample and hold circuitry, line buffers, and analog-to-digital converters) or digital circuitry (to optimize the performance of digital circuitry in the image co-processors such as image formatting circuitry). Meanwhile, the imager wafer may be optimized for optical performance. Optimization of wafers for analog, digital, and/or optical performance may involve altering the materials and methods used in forming completed wafers and the design and arrangement of circuits in the wafers, as examples.

Circuitry 15 conveys data to host subsystem 20 over path 18. Circuitry 15 may provide acquired image data such as captured video and still digital images to host subsystem 20.

Electronic device 10 typically provides a user with numerous high level functions. In a computer or advanced cellular telephone, for example, a user may be provided with the ability to run user applications. To implement these functions, electronic device 10 may have input-output devices 22 such as projectors, keypads, input-output ports, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include processors such as microprocessors, microcontrollers, digital signal processors, application specific integrated circuits, etc.

Device 10 may include position sensing circuitry 23. Position sensing circuitry 23 may include, as examples, global positioning system (GPS) circuitry, radio-frequency-based positioning circuitry (e.g., cellular-telephone positioning circuitry), gyroscopes, accelerometers, compasses, magnetometers, etc.

Figure 2:
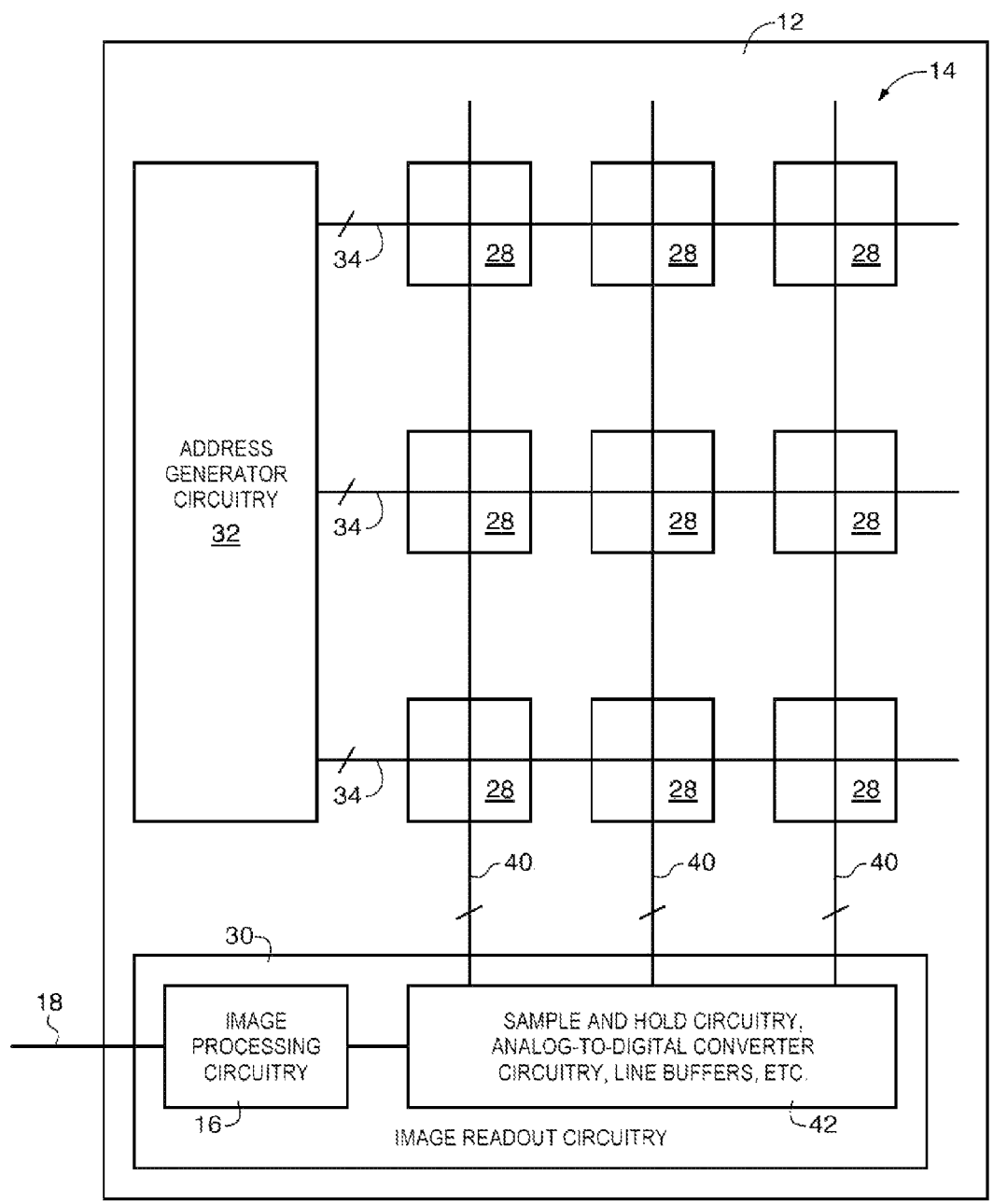
FIG. 2 is a diagram of an illustrative array of light-sensitive imaging pixels that may form an image sensor such as the image sensor of FIG. 1 in accordance with embodiments of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

Address generator circuitry 32 may generate signals on paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. With another suitable arrangement, circuitry 42 reads signals from groups of pixels 28 (e.g., groups formed from pixels located in multiple rows and columns of array 14) one group at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
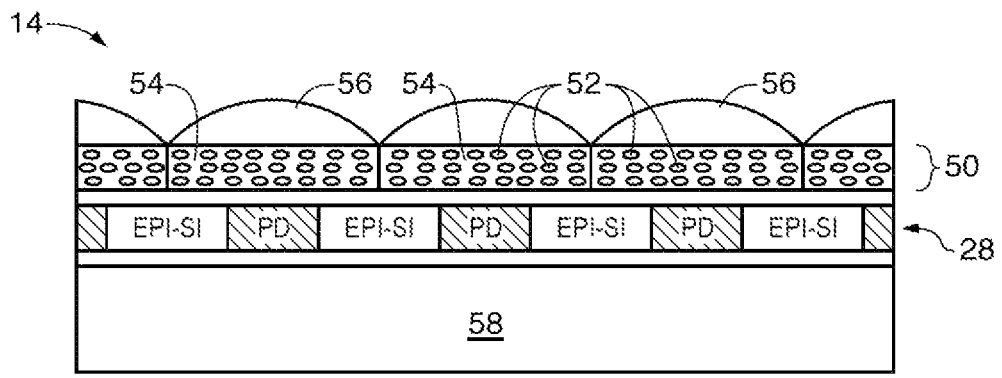
FIG. 3 is a cross-sectional side view of an illustrative image sensor that may include a color filter array formed with metallic nanoparticle optical filters in accordance with embodiments of the present invention.

In at least some arrangements, image sensor 14 may include one or more filters that include metallic nanoparticles. As an example and as shown in FIG. 3, image sensor 14 may include a color filter array 50 formed from a suspension of metallic nanoparticles 52 inside a matrix 54 (e.g., a medium). As shown in FIG. 3, the color filter array 50 may be disposed between an array of image sensing pixels 28 (which are formed on substrate 58) and an array of microlenses 56, each of which focusing incoming light onto a respective one of the pixels 28. The color filter array 50 may be formed in any desired pattern (e.g., the well-known Bayer pattern as well as other patterns, which may include red, green, and blue pixels, pixels sensitive to other colors, white pixels, infrared-sensitive pixels, ultraviolet-sensitive pixels, etc.). (While FIG. 3 illustrates a frontside illuminated image sensor, the metallic nanoparticle optical layers of the present invention could also be formed in backside illuminated image sensors.)

Any suitable technique may be used for forming the suspension of metallic nanoparticles 52 in matrix 54. As examples, the metallic nanoparticle 52 may be added to a preformed matrix 54 using chemical vapor deposition, pulsed chemical vapor deposition, atomic layer deposition, ion implantation, or other suitable manufacturing processes. The matrix 54 may also be formed using any suitable manufacturing processes. If desired, the suspension of metallic nanoparticles 52 in matrix 54 may be formed with alternating and repeating depositions of matrix 54 and nanoparticles 52.

Figure 4:
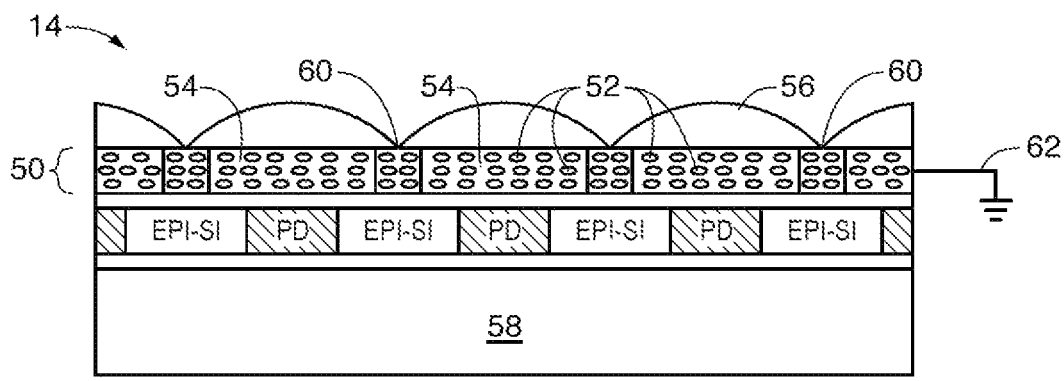
FIG. 4 is a cross-sectional side view of an illustrative image sensor that may include an in-pixel light grid formed with metallic nanoparticle optical filters and that may include a metallic nanoparticles formed in a conductive matrix in accordance with embodiments of the present invention

The matrix 54 may be a dielectric matrix such as silicon dioxide or titanium dioxide or may be a conductive matrix such as indium tin oxide (ITO) or zinc oxide (ZnOx). In embodiments in which matrix 54 is formed form conductive materials (such as ITO or ZnOx), matrix 54 may be grounded. An example of an arrangement of this type is shown in FIG. 4, in which matrix 54 is connected to ground 62. Since the metallic nanoparticles 52 are also conductive, grounding matrix 54 reduces stray current and noise and prevents charge buildup that could potentially adverse impact the performance of imager 14.

The metallic nanoparticles 52 in color filter array 54 may absorb (i.e., filter) undesired wavelengths as a result of the resonance of surface plasmons at the interface of the metal nanoparticles. In order to obtain color filter regions that filter different colors (e.g., so first regions pass only red light, second regions pass only green light, and third regions pass only blue light to provide a Bayer-patterned image sensor), various aspects of each region of the color filter 50 may be varied individually or in combination. Aspects that influence the optical properties and wavelengths that are absorbed by a filter formed with metallic nanoparticles include, but are not limited to, the type of metal used (e.g., silver particles, copper particles, or particles formed from another suitable element), the size of the nanoparticles (examples of typical sizes include 2 nanometers, 8 nm, 18 nm, and 28 nm, which larger particles typically absorbing longer, redder, wavelengths), the morphology (shape) of the metallic nanoparticles (which may be rod-shaped, spherical, and irregular, as examples, although spherical and irregular shapes may not be strongly dependent upon the angular dependence or polarization of incident light, which may be desirable in optical filter applications), the amount (i.e., density or concentration) of metallic nanoparticles formed in the matrix, the distribution of the metallic nanoparticles in the matrix, the material used in forming the matrix 54, the manufacturing processes utilized (e.g., thermal treatments, plasma and/or laser annealing processes, and other process may alter the size and morphology of the metallic nanoparticles, and thereby alter the optical properties of the particles).

In order to obtain regions with different filtering properties, one or more of these properties may be varied between regions. As an example, the same metallic nanoparticles and matrix may be used (e.g., silver in a silicon dioxide matrix), while the implantation, deposition, and or annealing conditions may be different for different regions, in order to adjust the size and morphology of the particles in each region to create shifts in their absorption spectra. In another example, different types of metallic nanoparticles (e.g., silver versus copper) may be used in different regions, while the same matrix (e.g., silicon dioxide) is used for those regions. In another example, different types of matrices maybe used in different regions, while the same type of metallic nanoparticles are used for those regions. In yet another example, different types of matrices and different types of metallic nanoparticles may be used in different regions (e.g., in forming different colors) of an optical filter. By varying these and other suitable properties of the metallic nanoparticles and matrices, optical filters that selectively block and pass desired wavelengths may be formed.

As shown in FIG. 4, nanoparticle optical filters 50 may be formed with a conductive matrix 54. Additionally or alternatively, imager 14 may include an in-pixel light grid 60 formed with nanoparticle optical filters. The in-pixel light grid 60 may serve to block crosstalk between adjacent pixels (e.g., the isolate each pixel from its neighbors).

Figure 5:
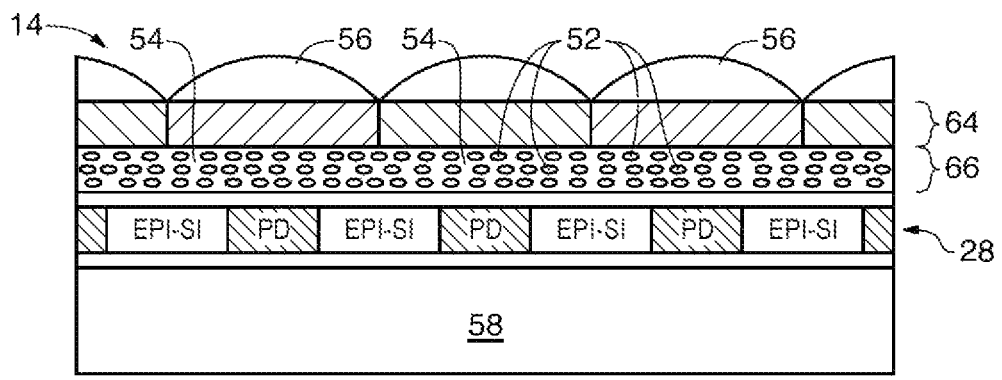
FIG. 5 is a cross-sectional side view of an illustrative image sensor that may include a metallic nanoparticle optical filter operable as an infrared filter and/or an ultraviolet filter in accordance with embodiments of the present invention.

As shown in FIG. 5, imager 14 may include a color filter array 64, which may be formed with conventional (e.g., pigment-based, dye-based, etc.) color filters, and an additional metallic nanoparticle optical film 66, containing nanoparticles 52. The metallic nanoparticle optical film 66 may augment the color filter array 64 to provide absorption of one desired wavelength bands. As an example, the metallic nanoparticle optical film may absorb infrared wavelengths and/or ultraviolet wavelengths. While FIG. 5 illustrates that the metallic nanoparticles 52 are formed in a separate film 66 than the color filter array 64, this is merely one potential arrangement. As another example, the metallic nanoparticles may be integrated into the film layer of the color filter array 64.

With other suitable arrangements, metallic nanoparticle optical films such those of FIGS. 3-5 may be utilized as a peripheral light blocking film. As an example, metallic nanoparticle optical films may block peripheral light (e.g., light not received directly through microlenses 56, including light scattered off the sides of microlenses 56). As another example, metallic nanoparticle optical films may block incident light being received by so-called dark pixels, which are shielded from incident light and used in providing image quality. As yet another example, one or more metallic nanoparticle films may cover reflecting surfaces in imager 14 such as conductive signal and power lines, in-pixel light grids, etc.

Figure 6:
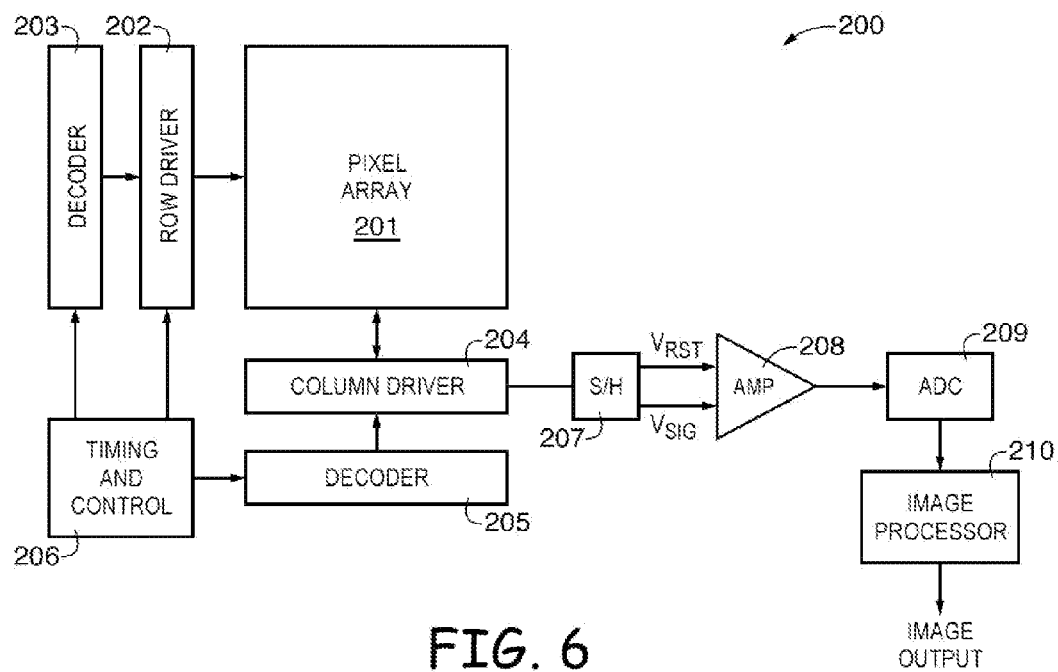
FIG. 6 is a block diagram of an imager employing one or more of the embodiments of FIGS. 1-5 in accordance with embodiments of the present invention.

FIG. 6 illustrates a simplified block diagram of imager 200 (e.g., an imager that incorporates a metallic nanoparticle optical film such as film 50). Pixel array 201 includes a plurality of pixels containing respective photosensors arranged in a predetermined number of columns and rows. The row lines are selectively activated by row driver 202 in response to row address decoder 203 and the column select lines are selectively activated by column driver 204 in response to column address decoder 205. Thus, a row and column address is provided for each pixel.

CMOS imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst and a pixel image signal Vsig for each pixel are sampled by sample and hold circuitry 207 associated with the column driver 204. A differential signal Vrst-Vsig is produced for each pixel, which is amplified by amplifier 208 and digitized by analog-to-digital converter 209. The analog to digital converter 209 converts the analog pixel signals to digital signals, which are fed to image processor 210 which forms a digital image.

Figure 7:
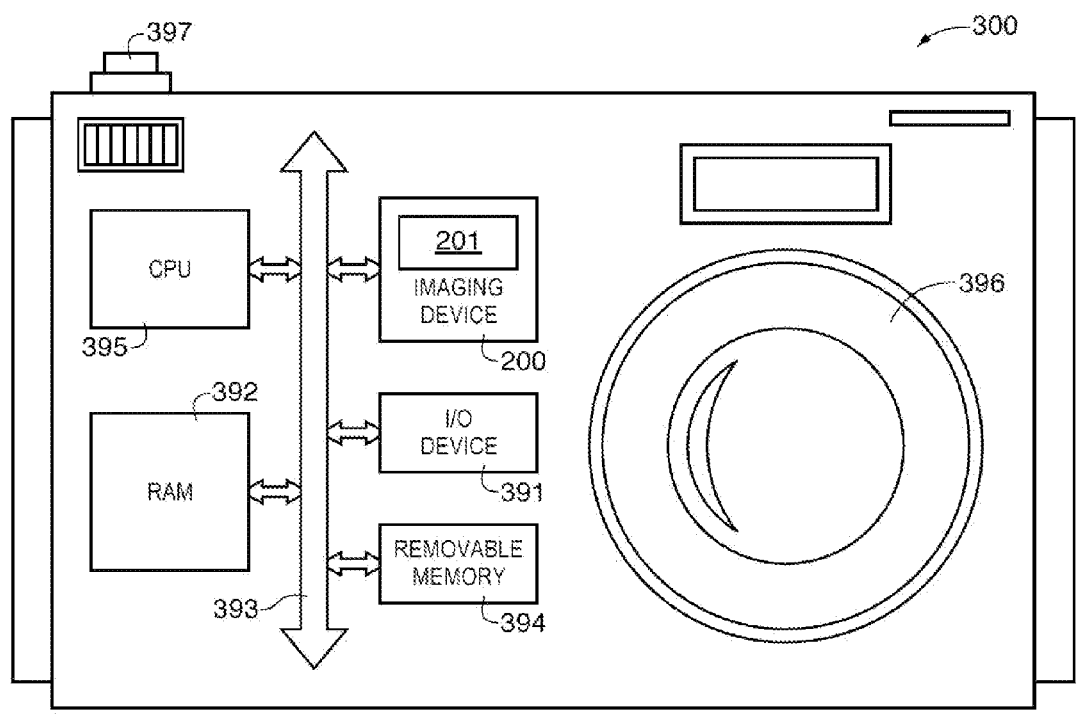
FIG. 7 is a block diagram of a processor system employing the imager of FIG. 8 in accordance with embodiments of the present invention.

FIG. 7 shows in simplified form a typical processor system 300, such as a digital camera, which includes an imaging device such as imaging device 200 (e.g., an imager that incorporates a metallic nanoparticle optical film such as film 50). Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems that may include one or more optical filters that include metallic nanoparticles in a matrix. The metallic nanoparticle optical filters may form a color filter array for an imager in the imaging system. Different metallic nanoparticle optical filters may be formed for each desired color. Properties of the metallic nanoparticles and matrices may be varied to achieve the desired optical filtering properties and pass the desired wavelength bands to the imager. As examples, the type of metal, the size of the nanoparticles, the shape of the nanoparticles, and the type of matrix in which the nanoparticles are formed may all influence the optical properties of the resulting metallic nanoparticle optical film.

The foregoing is merely illustrative of the principles of this invention which can be practiced in other embodiments.

What is claimed is:

1. An imager comprising:
   an array of image sensing pixels; and
   a color filter array associated with the array of image sensing pixels, wherein the color filter array comprises:
   first and second regions that filter different colors;
   a matrix; and
   metallic nanoparticles within the matrix, wherein the metallic nanoparticles filter incident light, wherein the metallic nanoparticles include first metallic nanoparticles in the first region and second metallic nanoparticles in the second region, and wherein the first and second metallic nanoparticles are different in at least one of: size, shape, type of metal, and concentration within the matrix.

2. The imager defined in claim 1 wherein the matrix comprises a dielectric matrix.

3. The imager defined in claim 1 wherein the matrix comprises a conductive matrix and wherein the imager further comprises a conductive path shorting the conductive matrix to a ground terminal.

4. The imager defined in claim 1 wherein the first metallic nanoparticles are of a different size than the second metallic nanoparticles.

5. The imager defined in claim 1 wherein the first metallic nanoparticles have a different shape than the second metallic nanoparticles.

6. The imager defined in claim 1 wherein the first metallic nanoparticles are formed from a different type of metal than the second metallic nanoparticles.

7. The imager defined in claim 1 wherein the first metallic nanoparticles are formed in a greater concentration within the matrix than the second metallic nanoparticles.

8. The imager defined in claim 1 wherein the first region includes a first matrix and wherein the second region includes a second matrix formed from a different material than the first matrix.

9. The imager defined in claim 1 further comprising an in-pixel light grid formed from additional metallic nanoparticles in the matrix.

10. The imager defined in claim 1 wherein the color filter array comprises colored pigment or colored dye in the matrix, wherein the colored pigment or colored dye also filters incident light.

11. The imager defined in claim 1 wherein the color filter array comprises at least one layer separate from the matrix and wherein the at least one layer comprises color filter pigment or color filter dye.

12. The imager defined in claim 1 wherein the metallic nanoparticles are thermally treated with at least one of a plasma annealing process and a laser annealing process.

13. The imager defined in claim 1 further comprising:
a peripheral light blocking film including additional metallic nanoparticles within a medium.

14. The imager defined in claim 1 wherein the array of imaging sensing pixels includes a plurality of dark pixels, the imager further comprising:
a light blocking film including additional metallic nanoparticles within a medium, wherein the light blocking film shields the dark pixels from incident light.

15. The imager defined in claim 1 further comprising:
a plurality of reflective surfaces including a conductive in-pixel light grid or conductive lines interconnecting the image sensing pixels; and
a light blocking film covering the reflective surfaces, wherein the light blocking film comprises additional metallic nanoparticles within a medium.

16. A system, comprising:
a central processing unit;
memory;
input-output circuitry; and
an imaging device that includes:
an imager that contains an array of imaging pixels;
a color filter array; and
an infrared optical filter that shields the array of imaging pixels from incident infrared light, wherein the color filter array overlaps the infrared optical filter, and wherein the infrared optical filter comprises:
a matrix; and
metallic nanoparticles within the matrix, wherein the metallic nanoparticles filter the incident infrared light.

17. The system defined in claim 16 wherein the matrix comprises a dielectric matrix.

18. The system defined in claim 16 wherein the matrix comprises a conductive matrix and wherein the imaging device further comprises a conductive path shorting the conductive matrix to a ground terminal in the system.

19. The system defined in claim 16 wherein the imaging device further comprises a color filter array and wherein the infrared optical filter is disposed between the array of imaging pixels and the color filter array.

20. A method of forming an optical filter in an imaging device, the method comprising:
depositing a matrix;
adding metallic nanoparticles to the matrix, wherein the metallic nanoparticles filter light before the light is received by imaging pixels in the imaging device; and
after adding the metallic nanoparticles to the matrix, altering at least one of the size and shape of the metallic nanoparticles.

21. The method defined in claim 20 wherein the metallic nanoparticles are added to the matrix using at least one process selected from the group consisting of:
ion implantation, chemical vapor deposition, pulsed chemical vapor deposition, and atomic layer deposition.

22. The method defined in claim 20 wherein altering at least one of the size and shape of the metallic nanoparticles comprises subjecting the optical filter to an annealing process.

* * * * *